United States Patent [19]

Hayashi et al.

[11] Patent Number: 4,651,188
[45] Date of Patent: Mar. 17, 1987

[54] SEMICONDUCTOR DEVICE WITH SPECIFICALLY ORIENTED CONTROL LAYER

[75] Inventors: Yasuhide Hayashi, Yokohama; Takayasu Kawamura, Zushi, both of Japan

[73] Assignee: Kabushiki Kaisha Meidensha, Tokyo, Japan

[21] Appl. No.: 730,118

[22] Filed: May 3, 1985

[30] Foreign Application Priority Data

May 29, 1984 [JP] Japan ................................. 59-109164

[51] Int. Cl.$^4$ ........................................... H01L 29/74
[52] U.S. Cl. ....................................... 357/38; 357/22; 357/36; 357/60; 357/89
[58] Field of Search ....................... 357/22, 38, 36, 20, 357/60, 89

[56] References Cited

U.S. PATENT DOCUMENTS 3,798,513  3/1974  Ono .
3,821,783  6/1974  Sugita et al. .
3,999,211 12/1976  Voss ........................................ 357/60
4,268,848  5/1981  Casey et al. ............................ 357/60
4,470,059  9/1984  Nishizawa et al. ................ 357/22 C
4,574,296  3/1986  Suedka et al. .......................... 357/38

FOREIGN PATENT DOCUMENTS 58-35973  3/1983  Japan ..................................... 357/38

Primary Examiner—Joseph E. Clawson, Jr.
Attorney, Agent, or Firm—Bachman & LaPointe

[57] ABSTRACT

In manufacturing a GTO, a silicon wafer is cut away along one of the crystal planes indicated by {n11} in Miller indices, and the burried gate or the current channels are so arranged on the crystal plane that at least one longitudinal direction thereof is substantially in parallel with at least one of axes indicated by <2nn> on condition that the inner product of the plane vector and the axis vector is zero. In the GTO thus manufactured, it is possible to minimize the crystal defect density on the crystal plane and thus to realize the GTOs having uniform turned-on voltage, in particular, while increasing the controllable current markedly.

9 Claims, 13 Drawing Figures

FIG. IO(A)
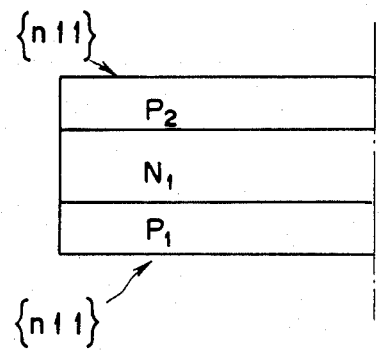
FIG. IO(C)
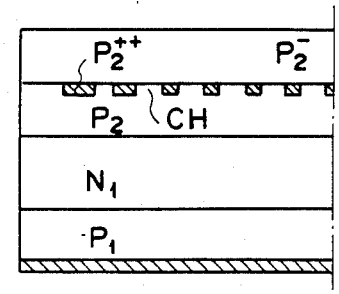
FIG. IO(B)
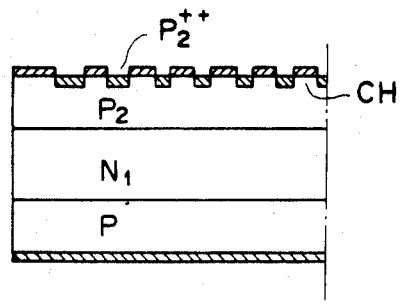
FIG. IO(D)
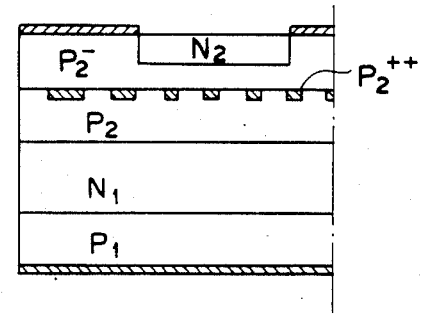

SEMICONDUCTOR DEVICE WITH SPECIFICALLY ORIENTED CONTROL LAYER

BACKGROUND OF THE INVENTION

1. Field of the Invention

The present invention relates to a semiconductor device and more specifically to a gate turn-off thyristor of buried gate structure type, which can increase the controllable current (a current flowing between the anode and the cathode) and make uniform the turned-on voltage (a voltage drop between the anode and the cathode).

2. Description of the Prior Art

In recent years, gate turn-off thyristors (referred to as GTO hereinafter) have widely been used in place of ordinary thyristors. This is because the GTOs can be turned off without use of any turning-off circuits including at least one inductor. Additionally, the GTO is high in efficiency and small in size, and further can control a high voltage and a large current as an excellent switching element. The above GTO can roughly be classified into two groups of surface gate type and buried gate type on the basis of the gate structure. In the surface gate GTO, since plural complicatedly-shaped gate electrodes are formed being exposed on the device surface, it is rather difficult to reliably realize a minitualized gate structure in dependence upon the present manufacturing technique. In contrast with this, in the buried gate GTO, since a high-concentration diffusion layer used as gate is formed being buried in a semiconductor layer and further covered by another expitaxially-formed layer (called buried gate), it is relatively easy to reliably realize a minitualized gate structure. The reason why the miniatulized gate structure is required is as follows: when the impurity atom concentration in the expitaxially formed layer is reduced, since it is possible to markedly increase the break-down voltage at the gate-cathode junction, it is possible to improve the turn-off characteristics of the GTO by applying a relatively high reverse voltage between the gate and the cathode. To further improve the turn-off characteristics, it is preferable to minitualize the gate structure for allowing the gate current to uniformly flow through the low-resistance gate layer.

In the buried gate GTO, it is further well known that when the impulity atom concentration of the diffusion layer is increased but the whole electric gate sheet resistance (determined by the total amount of dope) is reduced to decrease the resistance of the buried gate, it is possible to obtain a large gate current, that is, to improve the turn-off characteristics of the GTO. However, in the case where the electric gate resistance is excessively reduced, there exists a problem in that crystal defects readily occur in accordance with the high concentration diffusion layer. Since these crystal defects shorten the lifetime of the minority carriers in the N-type and the P-type semiconductor layers, there exists a problem in that the GTO characteristics inevitably disperse within the device and/or among the devices.

SUMMARY OF THE INVENTION

With these problems in mind, therefore, it is the primary object of the present invention to provide a semiconductor device or a gate turn-off thyristor in which the current channels formed between the high impurity atom concentration diffusion layers are so arranged that the influence of crystal defects upon GTO characteristics can be minimized in dependence upon the fact that the crystal defects distribute in certain directions crystallographically, in particular, in the first N-type semiconductor layer.

To achieve the above-mentioned object, in the semiconductor device having a controlling layer for controlling a switchable device current according to the present invention, at least one longitudinal direction of the controlling layer is formed substantially in parallel with at least one of crystal axes indicated by $<2nn>$ on a crystal plane indicated by $\{n11\}$ in Miller indices on condition that inner product of both vectors is zero.

To achieve the above-mentioned object, the method of manufacturing a gate turn-off thyristor according to the present invention comprises the following steps of: (a) preparing an N-type semiconductor wafer WA having an exposed crystal plane indicated by $\{n11\}$ in Miller indices; (b) diffusing impurity atoms on both the exposed surfaces of the prepared semiconductor wafer to form a first semiconductor layer $P_1$ and a second semiconductor layer $P_2$ in accordance with diffusion method; (c) forming a pattern mask on the second semiconductor layer $P_2$ to form a buried gate $P_2^{++}$ and current channels CH in accordance with photo engraving process in such a way that at least one longitudinal direction of current channels CH formed between the buried gate layers $P_2^{++}$ is arranged substantially in parallel with at least one of crystal axes indicated by $<2nn>$ on the crystal plane indicated by $\{n11\}$ on condition that inner product of a specific crystal plane vector and a specific crystal axis vector is zero before forming a third semiconductor layer $P_2^-$ and a fourth semiconductor layer $N_2$.

BRIEF DESCRIPTION OF THE DRAWING

The features and advantages of the semiconductor device or the gate turn-off thyristor according to the present invention over the prior-art gate turn-off thyristor will be more clearly appreciated from the following description of the preferred embodiments of the invention taken in conjunction with the accompanying drawings in which like reference symbols designate the same or similar elements or sections throughout the figures thereof and in which:

FIGS. 10(A) to 10(D) are illustrations for assistance in explaining the manufacturing steps of a gate turn-off thyristor including four PNPN semiconductor layers of buried low-resistance layer type according to the present invention.

DETAILED DESCRIPTION OF THE PREFERRED EMBODIMENTS

To facilitate understanding of the present invention, a reference will be made to a prior-art GTO of buried gate type, by way of example, with reference to the attached drawings.

Figure 1:
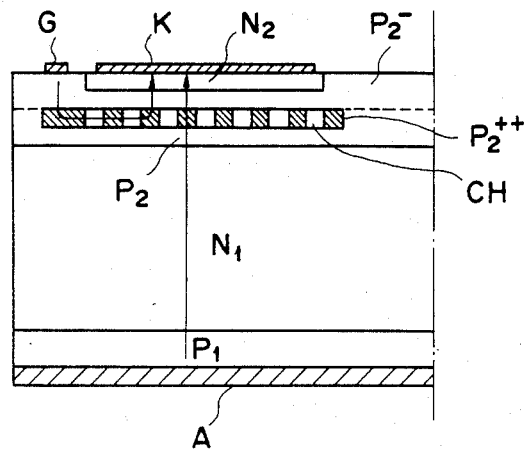
FIG. 1 is a diagrammatical cross-sectional view showing a typical prior-art buried gate GTO.

FIG. 1 is a cross-sectional view of a typical prior-art disc-shaped GTO including four PNPN semiconductor layers of buried low electric resistance layer type. The GTO includes an anode electrode A, a cathode electrode K and a gate electrode G. The four PNPN semiconductor layers are a first P-type layer $P_1$ formed in contact with the anode electrode A, a first N-type layer $N_1$ formed in contact with the first P-type layer $P_1$, a second P-type layer $P_2$, $P_2^-$ formed in contact with the first N-type layer $N_1$ and the gate electrode G, and a second N-type layer $N_2$ formed in the second P-type layer $P_2^-$ in contact with the cathode electrode K.

Figure 5:
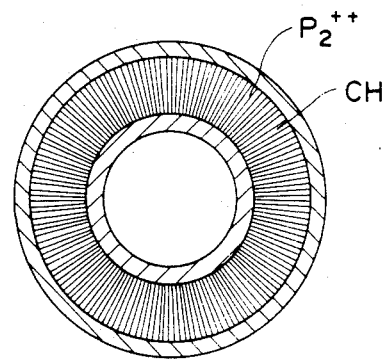
FIG. 5 is a plan view showing the structure of current channels CH radially arranged between the high concentration diffusion layers $P_2^{++}$ in the prior-art GTO.

The second P-type layer $P_2$, $P_2^-$ includes a medium impurity atom concentration P-type layer $P_2$ formed in contact with the first N-type layer $N_1$, a low impurity atom concentration (high electric resistance) layer $P_2^-$ in contact with the gate electrode G and the second N-type layer $N_2$, and a high impurity atom concentration (low electric resistance) layer $P_2^{++}$ radially arranged and buried in the medium concentration layer $P_2$ and under the low concentration layer $P_2^-$. Further, as best seen in FIG. 5, a plurality of current channels CH are formed between the high concentration (low resistance) layers $P_2^{++}$.

The turn-on and turn-off operations of the GTO of buried gate type will be described hereinbelow. When a gating voltage is applied to turn on the GTO between the gate electrode G and the cathode electrode K (G: positive; K: negative) under the condition that a forward bias voltage is applied between the anode electrode A and the cathode electrode K, the gate current flows from the gate electrode G to the cathode electrode K by way of the high resistance layer $P_2^-$, the low resistance layer $P_2^{++}$, and the high resistance layer $P_2^-$. Since electrons flow from the cathode electrode K to the gate electrode G, some electrons transfer from the cathode electrode K to the anode electrode A through the low resistance layer $P_2^{++}$ in order to turn on the GTO. When the GTO is turned on, GTO current flows from the anode electrode A to the cathode electrode K through the current channels CH formed between the low-resistance layers $P_2^{++}$ of miniaturized structure.

In contrast with this, when a reverse gating voltage is applied to turn off the GTO between the gate electrode G and the cathode electrode K (G: negative; K: positive) under the condition that an anode current flows from the anode A to the cathode K, the reverse gate current flows from the cathode electrode K to the gate electrode G by way of the high resistance layer $P_2^-$, the low resistance layer $P_2^{++}$, and the high resistance layer $P_2^-$. Since electrons flow from the gate electrode G to the cathode electrode K, electrons flowing from the cathode electrode K to the anode electrode A are reduced in order to turn off the GTO.

In the GTO as described above, when the impurity atom concentration in the epitaxial layer $P_2^-$ is reduced, since it is possible to markedly increase the break-down voltage at the gate-cathode junction, it is possible to improve the turn-off characteristics of the GTO by applying a relatively high reverse voltage between the gate G and the cathode K. To further improve the turn-off characteristics, it is preferable to minimize the gate structure $P_2^{++}$ and CH.

In the buried gate GTO, it is further well known that when the impurity atom concentration of the diffusion layer (low resistance layer) $P_2^{++}$ is increased but the layer resistance determined by the total amount of dope is reduced to decrease the electric resistance of the whole buried gate $P_2^{++}$, it is possible to obtain a large gate current, that is, to improve the turn-off characteristics of the GTO. However, in the case where the whole gate resistance is excessively reduced, there exists a problem in that crystal defects readily occur in accordance with the high concentration diffusion layer $P_2^{++}$. Since these defects shorten the lifetime of the minority carriers in the N-type and the P-type semiconductor layers $N_1$ and $P_2$, the GTO characteristics inevitably disperse within the devices and/or among the devices. Experiments indicate that crystal defects extending into the first N-type layer $N_1$ exert a serious influence upon the GTO characteristics.

Figure 2:
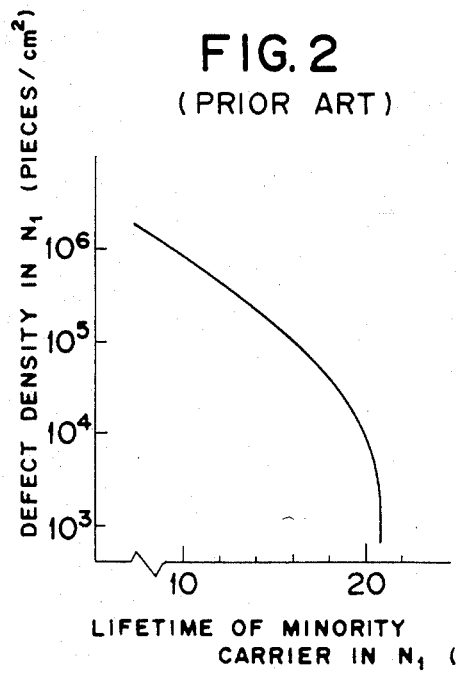
FIG. 2 is a graphical representation showing the relationship between the defect density in the first N-type layer $N_1$ and the lifetime of minority carrier in the same layer $N_1$, gold being diffused in the layer $N_1$ as lifetime shortening substance in the prior-art GTO.

FIG. 2 shows the relationship between the crystal defect density in the first N-type layer $N_1$ and the lifetime of the minority carrier in the layer $N_1$. This graphical representation indicates that the higher the defect density, the shorter the lifetime of the minority carrier.

Figure 3:
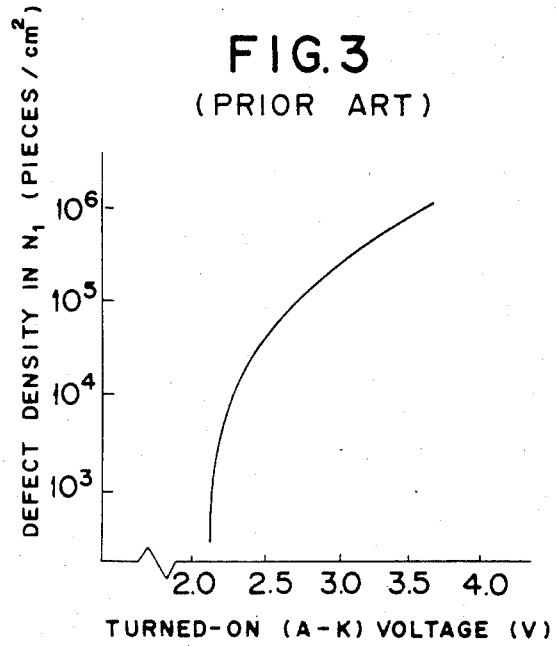
FIG. 3 is a graphical representation showing the relationship between the defect density in the first N-type layer $N_1$ and the turned-on voltage (a voltage drop between anode and cathode), gold being diffused in the layer $N_1$ as lifetime shortening substance in the prior-art GTO.

FIG. 3 shows the relationship between the crystal defect density in the first N-type layer $N_1$ and the turn-on voltage developed between the anode and the cathode when the GTO is being turned on. This graphical representation indicates that the higher the defect density, the higher the turned-on voltage.

Further, in the samples used for the above experiments, gold serving as a lifetime shortening substance is diffused at 760° C. for one hour with respect to FIG. 2 and at 800° C. for 30 minutes with respect to FIG. 3. The current density J is 350 A/cm² in both. Here, the current density J can be defined as I/S, where I denotes the current flowing between the anode A and the cathode K; S denotes the effective cathode area (the sum total of the current channel areas).

The crystal defect distribution in the GTO will be described hereinbelow. In the following description, braces { } denotes a generic crystal plane; angle brackets < > denotes a generic crystal axis; round parentheses ( ) denotes a specific crystal plane; square brackets [ ] denotes a specific crystal axis, all being defined in accordance with Miller indices.

Figure 4:
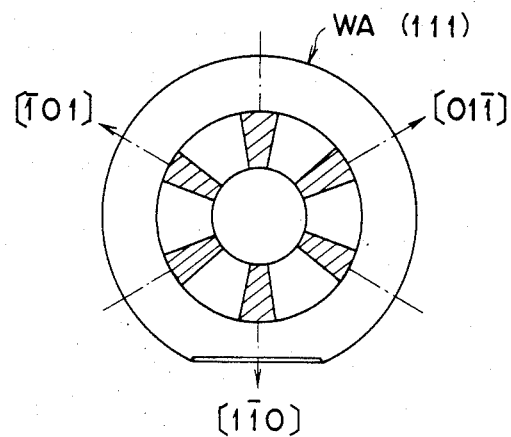
FIG. 4 is a diagrammatical plane view when seen from the anode side, which shows the distribution of crystal defects in the prior-art GTO.

FIG. 4 shows the crystal defect distribution of a buried gate GTO, when seen from the anode A side. The silicon wafer WA shown in FIG. 4 is cut along a specific crystal plane (111). In the drawing, the shaded portions indicates areas having a higher defect dencity as compared with portions other than the shaded areas. These defective portions can be obtained by taking only the N-type layer $N_1$ from the GTO and by emphasizing the defective areas by use of an etching agent such as Sirtl liquid, for instance. FIG. 4 indicates that there exists a regularity with respect to the crystal defect distribution, that is, the areas having a higher defect density appear at angular intervals of 60 degrees or in the three directions indicated by [01$\bar{1}$], [1$\bar{1}$0] and [$\bar{1}$01].

In an orthogonal coordinates, when a first vector A has components ($a_x$, $a_y$, $a_z$) and a second vector B has components ($b_x$, $b_y$, $b_z$), the inner product of both the vectors A and B can be expressed as $$A \cdot B = a_x b_x + a_y b_y + a_z b_z$$

$$\cos \theta = A \cdot B / |A| \cdot |B|$$

where $|A|$ and $|B|$ denote absolute values of the vectors and $\theta$ denotes an angle subtended by two vectors A and B.

In FIG. 4, since the inner products of the three axes vector and the plane vector are all zero as follows:

$$(1) \times (0) + (1) \times (1) + (1) \times (-1) = 0$$

$$(1) \times (1) + (1) \times (-1) + (1) \times (0) = 0$$

$$(1) \times (-1) + (1) \times (0) + (1) \times (1) = 0$$

$$\cos \theta = A \cdot B = 0 \text{ or } \theta = 90°$$

This indicates the plane vector (111) is perpendicular to the axis vectors [01$\bar{1}$], [0$\bar{1}$0] and [$\bar{1}$01] or that the three axis vectors lie on the plane.

In these high crystal defect density areas, the crystal defects spread from the high atom concentration layer $P_2^{++}$ to the anode electrode A, in the direction of the depth of the first N-type layer $N_1$, penetrating through the layer $N_1$. Further, in the case where the current channels CH or the low-resistance layer $P_2^{++}$ is arranged radially as shown in FIG. 5, it should be noted that the longitudinal directions of the current channels CH match the distribution directions in the high crystal defect density areas at angular intervals of 60 degrees. In other words, the longitudinal directions of the current channels CH are in parallel or roughly in parallel with the distribution directions of the high defect density areas in some sectorial areas. The fact that there exist high defect density areas at angular intervals of 60 degrees is a peculiar phenomenon in the case where the current channels CH are arranged on the crystal plane indicated by (111). Further, it is also possible to state that: the fact that the crystal defects spread on the crystal plane (111) is peculiar to the crystal defects. Furthermore, since the defects in the first N-type layer $N_1$ is mostly caused by the defects developed in the high atom concentration layer $P_2^{++}$, the defects appear greatly on the cathode side than on the anode side within the first N-type layer $N_1$. In the areas at which the defects appear in the longitudinal direction of the first layer $N_1$, the defects also readily appear in the lateral direction thereof, a great number of defects distributing in all directions in the first layer $N_1$.

Where there exist the above-mentioned crystal defects, since the lifetime of the minority carrier is reduced in the N-type layer $N_1$, there exists a problem in that the turned-on voltage (A-K voltage drop) increases and further the turn-on and/or turn-off characteristics are not uniform or disperse within the same device or among the devices. In particular, the controllable current flowing between the anode A and the cathode K decreases or changes in dependence upon the non-uniformity in device characteristics. Additionally, the above-mentioned crystal defect density is influenced by the manufacturing processes and/or the history of the semiconductor wafer.

In view of the above description, reference is now made to a first embodiment of the GTO according to the present invention.

Figure 6:
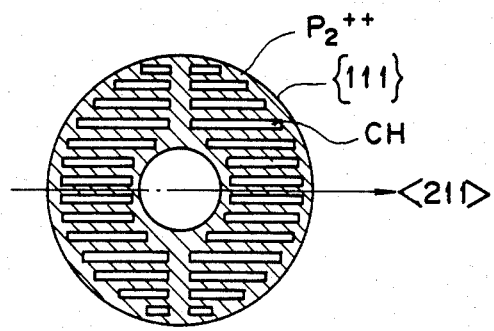
FIG. 6 is a plan view showing the structure of current channels CH arranged in parallel with each other between the high concentration diffusion layers $P_2^{++}$ in a first embodiment of the GTO according to the present invention.

FIG. 6 shows the arrangement of the current channels CH formed between the high impurity atom concentration layers $P_2^{++}$, when seen from the cathode K side. The surface is obtained by cutting a silicon wafer along a generic crystal plane indicated by {111} in Miller indices. Therefore, the generic plane {111} indicates all specific crystal planes such as (111); ($\bar{1}$11), (1$\bar{1}$1), (11$\bar{1}$); ($\bar{1}\bar{1}$1), ($\bar{1}$1$\bar{1}$), (1$\bar{1}\bar{1}$); and ($\bar{1}\bar{1}\bar{1}$). The longitudinal direction of the channels CH are arranged in parallel with a generic crystal axis indicated by <211> in Miller indices. The generic axis <211> indicates all specific axes such as [211], [121], [112]; [$\bar{2}$11], [$\bar{1}$21], [$\bar{1}$12]; [2$\bar{1}$1], [1$\bar{2}$1], [1$\bar{1}$2]; [21$\bar{1}$], [12$\bar{1}$], [11$\bar{2}$]; [$\bar{2}\bar{1}$1], [$\bar{2}$1$\bar{1}$], [$\bar{2}\bar{1}\bar{1}$], [$\bar{1}$2$\bar{1}$], [$\bar{1}\bar{2}$1], [$\bar{1}\bar{2}\bar{1}$]; [1$\bar{1}$2], [$\bar{1}$1$\bar{2}$], [1$\bar{1}\bar{2}$]; [2$\bar{1}\bar{1}$], [1$\bar{2}\bar{1}$], [11$\bar{2}$].

However, as already explained, since the condition that the axes lie on the plane is as follows:

Inner product of plane vector and axis vector = 0

It is impossible to select all the specific axes lying on the generic plane {111} from the generic axis <211>.

For instance, if {111} is (111) and <211> is [$\bar{2}$11], [1$\bar{2}$1], [11$\bar{2}$], since all the inner products of both the vectors are zero as follows:

$$(1) \times (-2) + (1) \times (1) + (1) \times (1) = 0$$

$$(1) \times (1) + (1) \times (-2) + (1) \times (1) = 0$$

$$(1) \times (1) + (1) \times (1) + (1) \times (-2) = 0$$

it is possible to consider that the axes [$\bar{2}$11], [1$\bar{2}$1], [11$\bar{2}$] all lie on the plane (111).

Similarly, if {111} is ($\bar{1}$11) and <211> is [211]; [1$\bar{1}$2], [12$\bar{1}$]; [$\bar{1}\bar{2}$1], [$\bar{1}$1$\bar{2}$]; [$\bar{2}$1$\bar{1}$], since all the inner products of both the vectors are zero as follows:

$$(-1) \times (2) + (1)(1) + (1)(1) = 0$$

$$(-1) \times (1) + (1)(-1) + (1)(2) = 0$$

$$(-1) \times (1) + (1)(2) + (1)(-1) = 0$$

$$(-1) \times (-1) + (1)(-2) + (1)(1) = 0$$

$$(-1)\times(-1)+(1)(1)+(1)(-2)=0$$

$$(-1)\times(-2)+(1)(-1)+(1)(-1)=0$$

it is possible to consider that the above six axes all lie on the plane $(\bar{1}11)$.

In the same manner, if the generic plane is $\{011\}$, it is possible to select any desired specific axes lying on the generic plane $\{011\}$ from the generic axis $<200>$. For instance, the plane is (011) and the axis is [200]. Similarly, if the generic plane is $\{211\}$, it is possible to select any desired specific axes lying on the generic plane $\{211\}$ from the generic axis $<222>$. For instance, the plane is (211) and the axis is $[\bar{2}22]$. If the generic plane is $\{311\}$, it is possible to select any desired specific axes lying on the generic plane $\{311\}$ from the generic axis $<233>$. For instance, the plane is (311) and the axis is $[\bar{2}33]$.

In summary, if the generic plane is $\{n11\}$ (n=0, 1, 2, 3 . . . ), it is possible to select any desired specific axes lying on the generic plane $\{n11\}$ from the generic axis $<2nn>$ (n=0, 1, 2, 3, . . . ).

The above-mentioned mutual relationship between the crystal planes $\{n11\}$ and the crystal axes $<2nn>$ has been found out on the basis of peculiar characteristics of defect density in crystal and in dependence upon a great number of experiments in order to minimize the occurrence of crystal defects.

Figure 7:
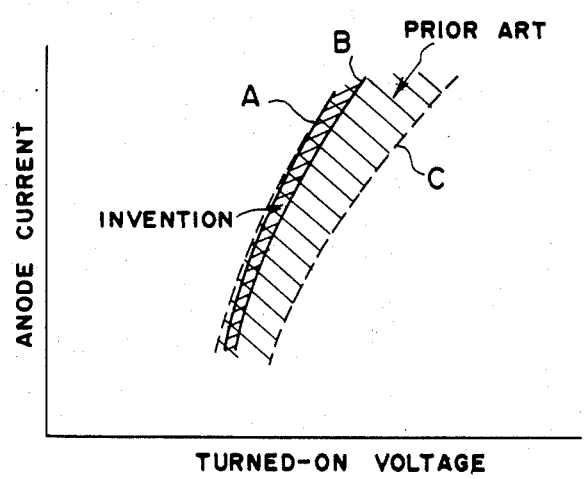
FIG. 7 is a graphical representation showing the relationship between the anode current and the turned-on voltage (a voltage drop between the anode and the cathode) in the form of dispersion range, in which the range defined by the dotted line curves A and C indicates the dispersion obtained in the prior-art GTO and the range defined by the solid line curves A and B indicates the dispersion obtained in the first embodiment of the GTO according to the present invention.

FIG. 7 is a graphical representation showing the relationship between the anode current and the turned-on voltage (a voltage drop between the anode and the cathode). The range defined by two solid line curves A and B indicates a dispersion range obtained by measuring the GTO according to the present invention, in which the current channels CH are arranged substantially in parallel with the generic axis $<211>$ on a wafer cut away along the generic plane $\{111\}$ as shown in FIG. 6. The range defined by two dotted line curves A and C indicates a dispersion range obtained by measuring the prior-art GTO, in which the current channels CH are arranged radially or roughly in parallel with three specific axes $[01\bar{1}]$, $[1\bar{1}0]$ and $[\bar{1}01]$ on a wafer cut away along the specific plane (111) as shown in FIG. 4. The number of GTO samples is 10 pieces, respectively. The graphical representation indicates that the dispersion range of the turned-on voltage in the GTO according to the present invention can be reduced to about 1/5 as compared with that in the prior-art GTO.

Figure 8:
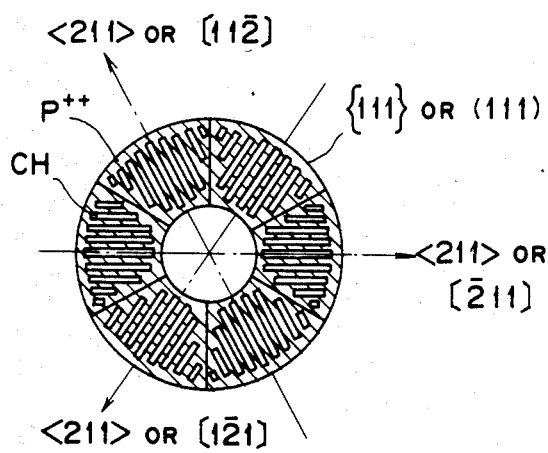
FIG. 8 is a plan view showing the structure of current channels CH arranged partially in parallel with each other between the high concentration diffusion layers $P_2^{++}$ in a second embodiment of the GTO according to the present invention.

FIG. 8 shows a second embodiment of the GTO according to the present invention, in which the current channels CH are arranged between the high impurity atom concentration layers $P_2^{++}$, when seen from the cathode K side. The wafer surface can be obtained by cutting a silicon crystal along the crystal plane $\{111\}$ in generic expression. The channels are divided into six sections and the longitudinal directions of the channels CH are independently arranged in parallel with three axes of $<211>$ being spaced at 60-degree angular intervals. One example of the above arrangement is as shown in FIG. 8: the crystal plane is (111); the first axis is $[\bar{2}11]$; the second axis is $[1\bar{2}1]$; the third axis is $[11\bar{2}]$, because the inner products of the plane vector (111) and the three axis vectors are zero, respectively.

In this second embodiment, it is possible to improve the directional balance of the gate resistance on the wafer surface. Further, experiments indicate that it is possible to reduce the dispersion range of the turned-on voltage in the GTO to about ⅓ as compared with that in the prior-art GTO and additionally to increase the controllable current flowing between the anode and the cathode as much as 20 percent.

Further, various observations have been made by emphasizing the defective areas by use of an etching agent, as already described hereinabove, in order to examine crystal defects in the first N-type layers $N_1$. The observations indicate that: in the case of the prior-art GTO in which the current channels CH are formed radially as shown in FIG. 5, a great number of crystal defects appear between the buried gate areas $P_2^{++}$ and further there exist differences in respective defect density between the devices. In contrast with this, in the case of the GTO in which the current channels CH are formed in three directions separately as shown in FIG. 8, a small number of defects appear between the buried gate areas (low-resistanced P-type layer) $P_2^{++}$.

Figure 9:
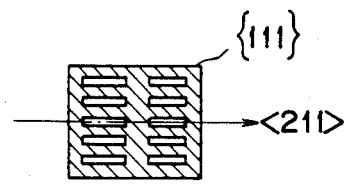
FIG. 9 is a plan view showing the structure of current channels CH arranged in parallel with each other between the high concentration diffusion layers $P_2^{++}$ in a third embodiment of the GTO according to the present invention.

FIG. 9 shows a third embodiment of the GTO according to the present invention, in which the GTO is formed in square shape. In this embodiment, the crystal surface on which the buried gate $P_2^{++}$ is formed is obtained by cutting a silicon crystal along the crystal plane $\{111\}$, and the longitudinal direction of the current channels CH are arranged in parallel with the axis $<211>$ similarly to the first embodiment shown in FIG. 6.

The method of manufacturing the GTO according to the present invention will be described hereinbelow with reference to FIGS. 10(A), (B), (C) and (D). The manufacturing steps are as follows:

(1) Impurity atoms (e.g. gallium) are diffused on both the surfaces of a negative (N-type) silicon wafer cut away along one of a generic crystal plane $\{n11\}$ by enclosed diffusion method in order to form a first P-type layer $P_1$ and a second P-type layer $P_2$. In the enclosed diffusion method, the silicon wafer and the gallium are enclosed within a quartz tube and then heated to an appropriate temperature at which the enclosed gallium can sufficiently diffused on both the surfaces of the silicon wafer.

(2) A predetermining pattern mask of siicon oxide ($SiO_2$) is formed on the surface of the second P-type layer $P_2$ in accordance with photo engraving process and boron is selectively diffused on the layer $P_2$ at a relatively high impurity atom concentration rate in order to form the high concentration (low resistance) P-type layer $P_2^{++}$. In this step, the pattern mask corresponding to the current channels CH is formed so that the longitudinal directions of the pattern mask is substantially in parallel with at least one of the generic crystal axes $<2nn>$ on the crystal plane $\{n11\}$. Further, in this step the specific crystal axes should be selected from the generic axes $<2nn>$ so that the inner product of the crystal axis vector and the crystal plane vector is zero.

(3) The lower impurity atom concentration (high resistance) P-type layer $P_2^-$ is further formed on the low-resistance layer $P_2^{++}$ and the second layer $P_2$ in accordance with epitaxial growth method by which another silicon layer is grown on a silicon monocrystal in the same crystal orientation in vapor phase epitaxy.

(4) another predetermined pattern mask of silicon oxide ($SiO_2$) is formed again on the surface of the lower concentration (high resistance) P-type layer $P_2^-$ in accordance with photo engraving process and phospher (P) is selectively diffused on the surface of the layer $P_2^-$ in order to form the second N-type layer $N_2$.

(5) The anode electrode A, the cathode electrode K, and the gate electrode G are formed, respectively.

The above embodiments have been described of the GTO in which the buried gate is formed in the second P-type layer $P_2$ as shown in FIG. 1. However, without being limited to these embodiments, it is possible to apply the concept of the present invention to the GTOs in which the buried gate is formed in the first N-type layer $N_1$. Further, it is possible to apply the present invention to various devices other than the GTOs, for instance, such as static induction type transistors, thyristors, or field effect transistors, etc. in which the crystal plane {n11} can be used and some controlling layers are formed within the device, in order to markedly reduce the serious influence of crystal defects upon the device characteristics.

As described above, in the GTO according to the present invention, since the semiconductor wafer is cut away along the crystal plane {n11} and the current channels are so arranged as to be substantially in parallel with the axes <2nn> on condition that the inner product of the plane vector and the axis vector is zero, there exists an advantage such that it is possible to minimize crystal defect density on the crystal plane and thus to reduce the dispersion in the device characteristics as small as possible while increasing the controllable current markedly.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. In a semiconductor switching device having at least three alternate semiconductor layers formed substantially in parallel with a crystal plane indicated by {n11} in Miller indices; a high impurity atom concentration control layer $P_2^{++}$ buried in one of said at least three alternate semiconductor layers; and a plurality of long and narrow current channels CH formed in said high impurity atom concentration control layer $P_2^{++}$, an anode A and a cathode k being formed on either outer side of said at least three alternate semiconductor layers, an anode current flowing from said anode A to said cathode k through said current channels CH perpendicularly to the crystal plane indicated by {n11} being controlled by a control current flowing through said high impurity atom concentration control layer $P_2^{++}$ in a direction substantially parallel to the crystal plane indicated by {n11}, the improvement wherein plural longitudinal directions of said current channels CH formed in said high impurity atom concentration control layer $P_2^{++}$ are substantially in parallel with at least one of crystal axes indicated by <2nn> on a crystal plate indicated by {n11} in Miller indices, where n denotes 0, 1, 2, 3, . . . , on condition that inner product of a crystal axis vector and a crystal plane vector is zero.

2. The semiconductor switching device as set forth in claim 1, wherein said switching device is a gate turn-off thyristor.

3. The semiconductor switching device as set forth in claim 1, wherein said switching device is a thyristor.

4. The semiconductor switching device as set forth in claim 1, wherein said switching device is a static induction transistor.

5. The semiconductor switching device as set forth in claim 1, wherein said switching device is an field effect transistor.

6. In a gate turn-off thyristor having four alternately-different PNPN semiconductor layers of:
 (a) a first P-type layer $P_1$ having an anode;
 (b) a first N-type layer $N_1$ adjoining to the first P-type layer $P_1$; and
 (c) a second P-type layer including:
  a first impurity atom concentration layer $P_2$ adjoining to the first N-type layer $N_1$;
  a second impurity atom concentration layer $P_2^-$ adjoining to the first impurity atom concentration layer $P_2$, a second concentration in the second impurity atom concentration layer $P_2^-$ being lower than a first concentration in the first impurity atom concentration layer $P_2$; and
  a third low-resistance impurity atom concentration layer $P_2^{++}$ buried in the first impurity atom concentration layer $P_2$ and between the first and second layers $P_2$ and $P_2^-$, current channels CH being formed between the third low resistance layers $P_2^{++}$; and
 (d) a second N-type layer $N_2$ formed in the second impurity atom concentration layer $P_2^-$ and having a cathode,
  the improvement wherein said third low-resistance impurity atom concentration layer $P_2^{++}$ is formed on a crystal plane indicated by {n11} in Miller indices and at least one longitudinal direction of the current channels CH formed between the third low resistance layers $P_2^{++}$ is arranged substantially in parallel with at least one of crystal axes indicated by <2nn> on the crystal plane {n11}, where n denotes 0, 1, 2, 3, . . . , on condition that inner product of the crystal axis vector and the crystal plane vector is zero.

7. The gate turn-off thyristor as set forth in claim 6, wherein said third low-resistance impurity atom concentration layer $P_2^{++}$ is formed on a generic silicon crystal plane indicated by {111} and the longitudinal direction of the current channels CH is arranged substantially in parallel with at least one of generic silicon crystal axes indicated by <211> on the generic silicon crystal plane {111}.

8. The gate turn-off thyristor as set forth in claim 7, wherein said third low resistance impurity atom concentration layer $P_2^{++}$ is formed on a specific silicon crystal plane (111) and the longitudinal direction of the current channels CH is arranged substantially in parallel with one of specific silicon crystal axes indicated by [$\bar{2}$11], [1$\bar{2}$1], [11$\bar{2}$] on the specific silicon crystal plane (111).

9. The gate turn-off thyristor as set forth in claim 7, wherein said third low resistance impurity atom concentration layer $P_2^{++}$ is divided into six portions in a specific silicon crystal plane (111) and the longitudinal directions of triaxial current channels CH are arranged substantially in parallel with three specific silicon crystal axes indicated by [$\bar{2}$11], [1$\bar{2}$1] and [11$\bar{2}$] on the specific silicon crystal plane (111), respectively.

* * * * *